United States Patent Office 3,582,401

Patented June 1, 1971

3,582,401

PHOTOSENSITIVE RESIST REMOVER COMPOSITIONS AND METHODS

John J. Berilla, Kirkwood, John H. Birk, St. Louis, John A. Caughlan, Webster Groves, and Richard H. Lalumondier, Crystal City, Mo., assignors to Mallinckrodt Chemical Works, St. Louis, Mo.

No Drawing. Filed Nov. 15, 1967, Ser. No. 683,105
Int. Cl. C23g *5/02;* G03c *5/08*
U.S. Cl. 134—3 5 Claims

ABSTRACT OF THE DISCLOSURE

Compositions for removing photosensitive resists from silicon or aluminum substrates in photolithographic applications contain an arylsulfonic acid (toluenesulfonic acid, xylenesulfonic acid), a phenol (phenol, cresol, chlorophenol) either alone or with up to 75% by weight of the total composition of a halogenated diluent, (o-dichlorobenzene, tetrachloroethylene). An arylsulfonic acid/phenol ratio of about 1, with about 50% diulent, is preferred.

BACKGROUND OF THE INVENTION

This invention relates to the field of photolithography. More specifically, this invention relates to compositions for removing photosensitive resists from surfaces of metal, semiconductor materials, and the like.

Photosensitive resist compositions are widely used in such photolithographic applications as chemical milling of aluminum and other metals, in the preparation of etched-and-filled name plates and decorative designs, in the preparation of electronic circuits ("printed circuits"), etc. Such so-called resists are used to protect selected areas of the surface of the substrate from the action of an etching solution while such etchant selectively attacks the unprotected areas of the substrate. Following completion of the etching operation and washing away of the residual etchant, it is necessary that the resist be removed from the protected surface to permit subsequent essential finishing operations.

While in certain applications, it is possible to remove the resist by buffing or by firing at a temperature sufficiently high to destroy the resist, in many applications it is preferable to remove the residual resist by means of a suitable solvent composition which chemically attacks the resist coating without significantly attacking the substrate. It is to such solvent compositions that the present invention is directed.

In general, photosensitive resist compositions are solutions or suspensions of photosensitive organic polymers, such as isoprene or a cimamic acid ester of polyvinyl alcohol, in suitable organic solvents, such as xylene or monochlorobenzene, together with a suitable sensitizing agent. A number of such resist compositions, adapted to a variety of applications, are commercially available. Typical of these is a series of compositions marketed by the Eastman Kodak Company, Rochester, N.Y. under such trade designations as KPR (KODAK Photo Resist), KTFR (KODAK Thin-Film Resist) and KMER (KODAK Metal-Etch Resist).

SUMMARY OF THE INVENTION

The present invention has as an object the provision of improved compositions and methods for removing photosensitive resist coatings from conventional substrate materials used in photolithography. Other objects and features will be in part apparent and in part pointed out hereinafter.

The invention accordingly comprises the products hereinafter described, the scope of the invention being indicated in the following claims.

Briefly, the invention is directed to compositions comprising:

(1) an arylsufonic acid component represented by the general formula:

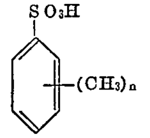

where $n$ is 0, 1 or 2, (2) a phenolic component, and (3) a non-aqueous, halogenated diluent, miscible with with the other components and having a boiling point above 75° C.

the weight ratio of said arylsulfonic acid component to said phenolic component being within the range of approximately 1:9 to approximately 9:1, said diluent being present to the extent of 0–75% by weight of the total composition, and to methods of using such compositions in removing phtosensitive resist coatings from conventional substrate materials.

DESCRIPTION OF THE PREFERRED EMBODIMENTS

The arylsulfonic acid component of the compositions of the invention may be benzenesulfonic acid or a toluene- or xylene-sulfonic acid, or it may be a mixture of two or more of such arylsulfonic acids. Preferably, this component is p-toluenesulfonic acid, or a mixture thereof with lesser amounts of one or more xylenesulfonic acids.

The phenolic component is preferably one of the readily available phenolic materials, such as phenol itself, a cresol, a xylenol, a halogenated phenol, or a mixture of two or more of such compounds.

Two-component compositions such as a mixture of p-toluenesulfonic acid and o-cresol have excellent capacity for removing several common photosensitive resists. On selected resists under selected conditions, compositions in which the ratio of toluenesulfonic acid to o-cresol varies from 1:9 to 9:1 are effective. The degree of effectiveness of a given formulation is different for each resist, but, in general, performance improves with increasing toluenesulfonic acid content. However, with increasing toluenesulfonic acid content, there is also an increased tendency for the components to inter-react to form an insoluble reaction product. A 50:50 mixture of p-toluenesulfonic acid and o-cresol is optimum.

In addition to their tendency to form insoluble reaction products, the two component arylsulfonic acid/phenol compositions tend to produce obnoxious odors and fumes at the elevated temperatures at which they are commonly used. These disadvantages are largely overcome by the addition of up to about 75% by weight of the total composition of a diluent of the type defined above. Among the useful diluents are carbon tetrachloride (B.P. 77° C.), trichloroethylene (B.P. 87° C.), and, especially o-dichlorobenzene (B.P. 180–183° C.) and tetrachloroethylene ($C_2Cl_4$, B.P. 146.5° C.). When the three-component compositions of the invention are heated under usual conditions of use, the heavy vapors of the diluent provide a protective mantle over the hot surface of the compositions, effectively diminishing the escape of obnoxious fumes and vapors and diluting the vapors that do escape. This is accomplished without significantly decreasing the effectiveness of the compositions as a resist remover.

If the composition is to be used at relatively high temperatures (140–160° C.) there is an advantage in using a combination of two or more halogenated compounds in the diluent compound, one boiling somewhat above the temperature of use and one boiling somewhat below the temperature of use. The lower boiling substance then provides protective action while the composition is heating to the temperature of use, and the high boiling substance provides protection while the composition is being used.

The following examples illustrate the invention:

Example 1

Separate formulations of p-toluenesulfonic acid with an equal weight of each of the following phenols were prepared:

(A) Phenol
(B) m-Cresol
(C) p-Cresol
(D) o-Cresol
(E) o-Chlorophenol
(F) p-Chlorophenol The compositions are hygroscopic. Absorption of atmospheric moisture leads to the formation of a crystalline precipitate.

The effectiveness of the compositions described above in removing photosensitive resists was determined. Polished wafers of semiconductor grade silicon were used as the test objects. The polished wafers were treated to form an oxide coating, and the oxidized wafers were cleaned by sonic agitation in trichloroethylene and dried by heating 1–3 minutes at 200° C. The cleaned, oxidized wafers were divided into two groups. One group was coated with KODAK Thin-Film Resist (KTFR) and the other group with KODAK Metal-Etch Resist (KMER). The coated wafers were spun to form a dry uniform coating and were then pre-baked at about 80° C. for 30 minutes. They were then masked with a standard test design and exposed to a high-intensity U.V. light source. The unexposed resist was dissolved in a suitable developer solution. The wafers were then submitted to a post-bake treatment at 180° C. for 30 minutes. The prepared wafers were then ready for use as test objects in the resist-removal trials.

Compositions (A)–(F) above were heated to 150° C. and, except as indicated below, specimens of both types of coated test objects were placed in each solution for 5 minutes. The test objects were then removed and rinsed wth a 1:1:1 mixture of trichloroethylene, isopropyl alcohol, and acetone. They were then returned to the resist-remover solution at 150° C. for another 5 minutes. Again they were removed and rinsed with the 1:1:1-wash solution. Finally, they were placed in a container of trichloroethylene and submitted to sonic agitation.

In each case, utilizing compositions (A)–(D) above, resist removal was 99–100% complete after two 5 minute treatments in the stripping solution, as indicated by test methods standard in the electronics industry. Composition E was tested only in the removal of KMER, and it was 95% effective after two 5 minute treatments.

Formulation F was tested against only KTFR, and it was 95% effective after a single 5 minute treatment.

Example 2

The following composition was prepared:

| | Part by weight |
|---|---|
| TX Acid[1] | 1 |
| o-Cresol | 1 |

[1] A mixture of arylsulfonic acids consisting principally of toluenesulfonic acids with minor proportions of xylenesulfonic cads, marketed by Witco Chemical Co., New York, N.Y., under the trade designation "TX Acid."

The properties of this composition, including its effectiveness in removing photosensitive resists from a silicon substrate, are approximately equivalent to those of Formulation (A)–(D) of Example 1. The composition satisfactorily removes a KTFR coating, post-baked on aluminum at 180° C. for thirty minutes, without significant attack on the aluminum substrate.

Example 3

The following compositions were prepared:

| | A, g. | B, g. |
|---|---|---|
| TX acid | 100 | 100 |
| o-Cresol | 175 | 100 |
| o-Dichlorobenzene | 50 | 200 |

These compositions effectively remove photosensitive resists from a silicon substrate.

Example 4

The following composition was prepared:

| | Parts by weight |
|---|---|
| TX acid | 25 |
| o-Cresol | 15 |
| p-Chlorophenol | 10 |

This composition effectively removes photosensitive resists from a silicon substrate.

EXAMPLE 5

The following compositions were prepared:

| | Parts by weight | | |
|---|---|---|---|
| | A | B | C |
| TX acid | 25 | 25 | 25 |
| Phenol | 25 | | 20 |
| p-Chlorophenol | | 25 | 5 |
| o-Dichlorobenzene | 50 | 50 | 50 |

These compositions are equivalent in resist-remover performance to Compositions (A)–(D) of Example 1. They absorb moisture and form a resulting precipitate to a lesser extent and are more stable with respect to interreaction of components at elevated temperatures to form precipitates on cooling. Such reaction products redissolve when the composition is reheated. Formation of obnoxious vapors at 150° C. is less than with the compositions of Example 1.

Example 6

The following composition was prepared:

| | Parts by weight |
|---|---|
| TX acid | 25 |
| Phenol | 25 |
| o-Dichlorobenzene | 45 |
| Tetrachloroethylene | 5 |

This composition removes 99–100% of KMER, KHFR, KPR and KPR-2 resists by the method described in Example 1. Its effectiveness is essentially undiminished after the composition has been held at a temperature of 150° C. for periods as long as seven hours prior to the test. The composition can be used at temperatures as high as 160°–165° C. Evolution of obnoxious odors and varops is low. In other respects, the properties are similar to those of the compositions of Example 5.

In view of the above, it will be seen that the several objects of the invention are achieved and other advantageous results obtained.

As various changes could be made in the above products and methods without departing from the scope of the invention, it is intended that all matter contained in the above description shall be interpreted as illustrative and not in a limiting sense.

What is claimed is:

1. The method of removing a photosensitive resist coating from the surface of a substrate material selected from the group consisting of silicon and aluminum which comprises contacting said coated substrate material, for a time sufficient to loosen said coating, with a composition preheated to a temperature of at least about 75° C. which consists essentially of (1) an arylsulfonic acid component represented by the general formula:

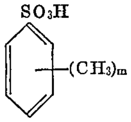

where *n* is 0, 1 or 2, (2) a phenolic component selected from the group consisting of phenol, halogenated phenols, cresols and xylenols, and (3) a halogenated diluent, miscible with the other components, selected from the group consisting of carbon tetrachloride, trichloroethylene, o-dichlorobenzene, and tetrachloroethylene, the weight ratio of said arylsulfonic acid component to said phenolic component being within the range of approximately 1:9 to approximately 9:1, said diluent being present to the extent of 0–75% by weight of the total composition, and rinsing away said loosened coating with a solvent therefor.

2. The method of removing a photosensitive resist coating from the surface of a substrate material as defined in claim 1 wherein said composition is first heated to a temperature within the range of approximately 75° C. to approximately 250° C.

3. The method of removing a photosensitive resist coating from the surface of a substrate material as defined in claim 2 wherein the arylsulfonic acid component of said composition consists essentially of p-toluenesulfonic acid and the phenolic component of said composition is phenol.

4. The method of removing a photosensitive resist coating from the surface of a substrate material as defined in claim 3 wherein the ratio of the arylsulfonic acid component of said composition to the phenolic component of said composition is approximately one.

5. The method of removing a photosensitive resist coating from the surface of a substrate material as defined in claim 4 wherein the halogenated diluent constitutes approximately 50% by weight of the composition and consists of o-dichlorobenzene and tetrachloroethylene in the approximate proportion of 45:5.

References Cited

UNITED STATES PATENTS

| | | | |
|---|---|---|---|
| 3,075,923 | 1/1963 | Berst et al. | 252—144 |
| 3,335,087 | 8/1967 | Keers et al. | 252—143 |
| 3,391,085 | 7/1968 | Crockett | 252—143 |

FOREIGN PATENTS

| | | | |
|---|---|---|---|
| 860,374 | 2/1961 | Great Britain | 252—143 |

OTHER REFERENCES

Applications Data for Kodak Photosensitive Resist, Eastman Kodak Co., 1966, p. 5.

LEON D. ROSDOL, Primary Examiner

A. I. RADY, Assistant Examiner

U.S. Cl. X.R.

96—36, 36.2; 134—38, 41; 252—143, 171